United States Patent
Umehara et al.

(10) Patent No.: US 12,446,153 B2
(45) Date of Patent: Oct. 14, 2025

(54) CIRCUIT SUBSTRATE AND METHOD FOR MANUFACTURING THE SAME

(71) Applicant: KYOCERA Corporation, Kyoto (JP)

(72) Inventors: Motohiro Umehara, Yasu (JP); Yoshinori Kubo, Omihachiman (JP)

(73) Assignee: KYOCERA Corporation, Kyoto (JP)

( * ) Notice: Subject to any disclaimer, the term of this patent is extended or adjusted under 35 U.S.C. 154(b) by 182 days.

(21) Appl. No.: 18/018,522

(22) PCT Filed: Jul. 21, 2021

(86) PCT No.: PCT/JP2021/027274
§ 371 (c)(1),
(2) Date: Jan. 27, 2023

(87) PCT Pub. No.: WO2022/024907
PCT Pub. Date: Feb. 3, 2022

(65) Prior Publication Data
US 2023/0300983 A1    Sep. 21, 2023

(30) Foreign Application Priority Data
Jul. 29, 2020    (JP) .................................. 2020-128334

(51) Int. Cl.
H05K 1/11    (2006.01)
H05K 3/42    (2006.01)

(52) U.S. Cl.
CPC ............. *H05K 1/115* (2013.01); *H05K 3/423* (2013.01); *H05K 2201/09563* (2013.01); *H05K 2203/0723* (2013.01)

(58) Field of Classification Search
None
See application file for complete search history.

(56) References Cited

U.S. PATENT DOCUMENTS 5,027,062 A * 6/1991 Dugan ............... G01R 1/07314
324/750.29
5,403,672 A * 4/1995 Urasaki ................. H05K 3/062
428/607

(Continued)

FOREIGN PATENT DOCUMENTS

CN    1307794 A  *  8/2001  ............. H05K 3/384
CN    103609204 A  *  2/2014  ............. B01J 23/52

(Continued)

OTHER PUBLICATIONS

Original and Translation of DE102006001602 (Year: 2007).*

*Primary Examiner* — Timothy J. Dole
*Assistant Examiner* — Muhammed Azam
(74) *Attorney, Agent, or Firm* — Procopio, Cory, Hargreaves & Savitch LLP

(57) ABSTRACT

A method for manufacturing a circuit substrate including an insulation substrate formed with a plurality of via holes passing through a first main surface and a second main surface and a metal with which the via holes are filled, the first and second main surfaces being opposing main surfaces, comprising forming, in the insulation substrate, the via hole or a non-through hole opening only on the second main surface; filling the via hole or the non-through hole with the metal; polishing the metal of at least one of the main surfaces to form a step between the metal and the insulation substrate; coating a polished surface of the metal by plating; and polishing the metal on the first main surface and the second main surface.

15 Claims, 3 Drawing Sheets

(56) References Cited

U.S. PATENT DOCUMENTS

| | | | | |
|---|---|---|---|---|
| 5,487,999 | A * | 1/1996 | Farnworth | H01L 22/20 257/E23.07 |
| 5,517,758 | A * | 5/1996 | Nakamura | H05K 3/4661 216/36 |
| 6,370,768 | B1 * | 4/2002 | Itabashi | H05K 3/4652 205/187 |
| 6,492,597 | B2 * | 12/2002 | Fujii | H05K 3/426 361/792 |
| 6,534,723 | B1 * | 3/2003 | Asai | H01L 23/49811 174/262 |
| 6,610,417 | B2 * | 8/2003 | Andresakis | H01C 1/14 205/206 |
| 6,800,816 | B2 * | 10/2004 | Kaneda | H01L 23/49816 174/250 |
| 6,831,009 | B2 * | 12/2004 | Itabashi | C23C 18/40 438/672 |
| 6,930,044 | B1 * | 8/2005 | Weng | H05K 3/243 438/686 |
| 7,214,305 | B2 * | 5/2007 | Matsuda | H01L 21/2885 205/186 |
| 7,915,088 | B2 * | 3/2011 | Kobayashi | H01L 24/16 438/615 |
| 8,233,289 | B2 * | 7/2012 | Maeda | H01L 23/49822 361/795 |
| 8,338,716 | B2 * | 12/2012 | Nakahara | H05K 3/244 174/257 |
| 8,399,779 | B2 * | 3/2013 | Ogawa | H05K 1/113 174/262 |
| 8,409,726 | B2 * | 4/2013 | Shim | H05K 3/384 428/209 |
| 8,578,601 | B2 * | 11/2013 | Ohsumi | H05K 3/426 29/830 |
| 8,692,135 | B2 * | 4/2014 | Funaya | H01L 24/24 361/764 |
| 8,946,906 | B2 * | 2/2015 | Maeda | H01L 23/49822 257/E23.145 |
| 9,232,652 | B2 * | 1/2016 | Fushie | H05K 3/423 |
| 9,426,887 | B2 * | 8/2016 | Hosoi | H05K 1/115 |
| 9,565,775 | B2 * | 2/2017 | Shimizu | H05K 1/115 |
| 9,681,546 | B2 * | 6/2017 | Sunohara | H01L 23/49894 |
| 9,711,440 | B2 * | 7/2017 | Nakamura | H05K 3/427 |
| 9,814,139 | B2 * | 11/2017 | Watanabe | H05K 1/116 |
| 9,818,714 | B2 * | 11/2017 | Kang | H01L 21/486 |
| 9,820,391 | B2 * | 11/2017 | Shimizu | H01L 24/13 |
| 9,875,957 | B2 * | 1/2018 | Shimizu | H05K 3/4644 |
| 10,111,341 | B2 * | 10/2018 | Jeong | G05G 1/30 |
| 10,426,031 | B2 * | 9/2019 | Kaibuki | H05K 1/09 |
| 10,477,692 | B2 * | 11/2019 | Sakamoto | H05K 3/064 |
| 10,813,209 | B2 * | 10/2020 | Kezuka | H05K 3/4644 |
| 10,925,171 | B2 * | 2/2021 | Ori | B32B 15/18 |
| 10,950,768 | B2 * | 3/2021 | Abe | H05K 1/0306 |
| 11,026,327 | B2 * | 6/2021 | Shin | H05K 3/428 |
| 11,089,691 | B2 * | 8/2021 | Kim | C09K 13/00 |
| 11,284,521 | B2 * | 3/2022 | Stay | H05K 1/097 |
| 2004/0217455 | A1 | 11/2004 | Shiono et al. | |
| 2005/0039948 | A1 | 2/2005 | Asai et al. | |
| 2005/0118448 | A1 * | 6/2005 | Brenneman | H05K 3/384 428/209 |
| 2006/0042832 | A1 * | 3/2006 | Sato | H05K 3/4614 174/257 |
| 2006/0144618 | A1 * | 7/2006 | Song | H05K 3/423 29/830 |
| 2006/0191798 | A1 * | 8/2006 | Sano | H05K 3/384 205/292 |
| 2007/0158852 | A1 * | 7/2007 | Hsu | H05K 3/421 257/781 |
| 2010/0006334 | A1 * | 1/2010 | Takenaka | H05K 3/465 174/262 |
| 2010/0084275 | A1 * | 4/2010 | Hanafusa | C25D 3/38 205/296 |
| 2011/0308848 | A1 * | 12/2011 | Ito | H05K 3/045 29/829 |
| 2015/0049445 | A1 * | 2/2015 | Kim | H05K 1/0298 361/748 |
| 2017/0303405 | A1 * | 10/2017 | Fukuchi | H05K 3/022 |
| 2017/0367194 | A1 * | 12/2017 | Lee | C23C 14/08 |
| 2020/0029441 | A1 | 1/2020 | Takemori et al. | |
| 2020/0315023 | A1 * | 10/2020 | Nad | H05K 3/108 |
| 2021/0371997 | A1 * | 12/2021 | Devahif | C25D 1/04 |
| 2022/0078907 | A1 * | 3/2022 | Kim | B32B 7/02 |
| 2023/0089948 | A1 * | 3/2023 | Kasuga | H05K 1/115 174/261 |
| 2023/0300983 | A1 * | 9/2023 | Umehara | H05K 3/426 174/261 |

FOREIGN PATENT DOCUMENTS

| | | | | |
|---|---|---|---|---|
| CN | 108200734 | A * | 6/2018 | H05K 3/423 |
| DE | 102006001602 | A1 * | 5/2007 | H01L 21/4846 |
| JP | H5-315752 | A | 11/1993 | |
| JP | 2001-274548 | A | 10/2001 | |
| JP | 2001-291946 | A | 10/2001 | |
| JP | 2005310934 | A | 11/2005 | |
| JP | 2006-66658 | A | 3/2006 | |
| JP | 2010021327 | A | 1/2010 | |
| JP | 2015-43391 | A | 3/2015 | |
| JP | 2015041718 | A * | 3/2015 | |
| JP | 2017123377 | A * | 7/2017 | H05K 1/113 |
| JP | 2018-148086 | A | 9/2018 | |
| JP | 2020013977 | A * | 1/2020 | H05K 1/024 |
| KR | 20070034766 | A * | 3/2007 | |
| KR | 100813441 | B1 * | 3/2008 | |
| KR | 20100017562 | A * | 2/2010 | |
| KR | 20100043811 | A * | 4/2010 | |
| KR | 20120024115 | A * | 3/2012 | |
| KR | 20120072633 | A * | 7/2012 | |
| KR | 20120137176 | A * | 12/2012 | |
| KR | 20130087148 | A * | 8/2013 | |
| KR | 20190012075 | A * | 2/2019 | |
| KR | 20200007308 | A * | 1/2020 | |
| KR | 20230063753 | A * | 5/2023 | |
| TW | I391061 | B * | 3/2013 | |
| WO | WO-2010117383 | A1 * | 10/2010 | A61N 1/3754 |
| WO | WO-2011125874 | A1 * | 10/2011 | H01L 24/32 |
| WO | WO-2012053729 | A1 * | 4/2012 | H05K 3/4652 |
| WO | WO-2020196105 | A1 * | 10/2020 | C23C 18/1646 |

* cited by examiner

CIRCUIT SUBSTRATE AND METHOD FOR MANUFACTURING THE SAME

TECHNICAL FIELD

The present invention relates to a circuit substrate and a method for manufacturing the same, and particularly relates to a via metal passing through both main surfaces of an insulation substrate and electrically conducts the main surfaces to each other and a method for forming the same.

BACKGROUND OF INVENTION

In order to form a three-dimensional circuit in accordance with the miniaturization and high density of electronic components, a circuit substrate, in which wirings formed on both main surfaces of an insulation substrate are connected by a via metal passing through both main surfaces, is used. The via metal is formed by a method of forming a via hole in the insulation substrate and then filling the via hole with a metal, or a method of filling, with a metal, a non-through hole formed from a first main surface of the insulation substrate and then polishing a second main surface to expose the via metal. As a method of filling the via hole or the non-through hole with a metal, a plating method and a method of firing a paste including metal particles are used (Patent Documents 1 to 3).

CITATION LIST

Patent Literature

Patent Document 1: JP 2015-43391 A
Patent Document 2: JP 2006-66658 A
Patent Document 3: JP 2001-291946 A

SUMMARY

Solution to Problem

A method for manufacturing a circuit substrate according to the present disclosure is a method for manufacturing a circuit substrate including an insulation substrate formed with a plurality of via holes passing through a first main surface and a second main surface and a metal with which the via holes are filled, the first main surface and the second main surface being opposing main surfaces. The method for manufacturing a circuit substrate according to the present disclosure includes: forming, in the insulation substrate, the via hole or a non-through hole opening only on the second main surface; filling the via hole or the non-through hole with the metal; polishing the metal of at least one of the main surfaces to form a step between the metal and the insulation substrate; coating a polished surface of the metal by plating; and polishing the metal on the first main surface and the second main surface.

A circuit substrate of the present disclosure includes an insulation substrate formed with a plurality of via holes passing through a first main surface and a second main surface, the first main surface and the second main surface being opposing main surfaces, a second metal layer with which the via holes are filled, and a third metal layer that coats an entire surface of the second metal layer.

DESCRIPTION OF EMBODIMENTS

Figure 1A:
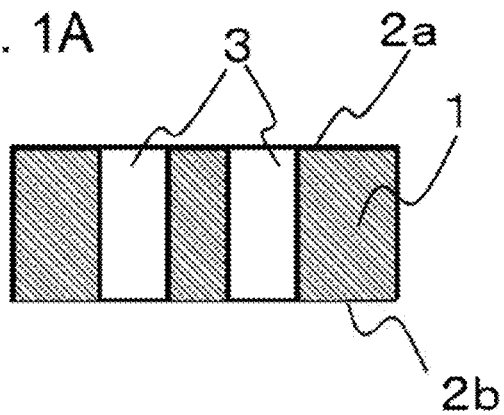
FIGS. 1A to IG are schematic views illustrating a first embodiment of the present disclosure.

Among methods of forming a via metal, a method using a paste requires firing at a relatively high temperature. Therefore, thermal stress due to shrinkage after firing causes deformation and cracking. Particularly, when the firing temperature is equal to or greater than the melting point of the via metal, the effect of shrinkage due to phase transformation is also added. When the firing temperature is equal to or less than the melting point of the metal, the metal becomes porous. As a result, the metal includes many voids or glass components, which makes it difficult to reduce the surface roughness of a polished surface.

In a plating method, since the via metal can be formed at a relatively low temperature, deformation and cracking are less likely to occur. A dense metal with few voids can be formed, and the surface roughness of a polished surface can be easily reduced. However, voids are likely to be formed near a center line where a metal grown from an inner wall surface of a via hole joins.

Patent Document 3 also proposes a method of filling a via with a paste and coating the via by plating. However, a via metal formed by paste firing has the problem as described above. Plating solution remains in many voids, which may adversely affect subsequent processes or product characteristics.

The present disclosure can provide a circuit substrate including a via metal that is dense and has few voids on the surface thereof, and causing less deformation and cracking.

Embodiments of the present invention are described below with reference to the drawings. A circuit substrate 10 includes an insulation substrate 1 formed with a via hole 3 passing through two opposing main surfaces 2 (first main surface 2a and second main surface 2b), and a via metal 4 with which the via hole 3 is filled (hereinafter, simply referred to as "metal 4"). The main surface 2 of the insulation substrate 1 and the surface of the via metal 4 are processed to have substantially the same height, and a wiring metal (not illustrated) connected to the via metal 4 is disposed on the main surface 2.

A method for manufacturing the circuit substrate 10 of the present disclosure includes: forming, in the insulation substrate 1, a via hole 3 that opens on both main surfaces 2 or a non-through hole 6 opening only on the second main surface 2b; filling the via hole 3 or the non-through hole 6 with the metal 4; polishing the metal 4 of at least one of the main surfaces 2 to form a step between the metal and the insulation substrate; a coating step of coating the polished surface of the metal 4 by plating; and polishing the metal 4 on the first main surface 2a and the second main surface 2b, which makes it possible to provide the circuit substrate 10 in which the metal 4 is dense and has few voids on the surface thereof, causing less deformation and cracking.

FIG. 1 is a schematic view illustrating a first embodiment of the present disclosure. The first embodiment includes a hole forming step (FIG. 1A) of forming the via hole 3 in the insulation substrate 1; a seed layer formation step (FIG. 1B) of forming a seed layer 5 on the first main surface 2a; a blocking step (FIG. 1C) of blocking a side of the via hole 3 facing the first main surface 2a with a first metal layer 4a by electroplating; a filling step (FIG. 1D) of filling the via hole 3 with a second metal layer 4b by electroplating; a first polishing step (FIG. 1E) of polishing the metal 4 of any one of the main surfaces 2 to form a step between the metal 4 and the insulation substrate 1; a coating step (FIG. 1F) of coating the polished surface of the metal 4 with a third metal layer 4c by plating; and a second polishing step (FIG. 1G) of polishing the metal 4 on the first main surface 2a and the second main surface 2b. In the first embodiment, the metal 4 includes the first metal layer (blocking layer) 4a, the second metal layer (filling layer) 4b, and the third metal layer (covering layer) 4c. FIG. 1 illustrates an embodiment in which one main surface 2 (second main surface 2b) is polished in the first polishing step and both the main surfaces 2 are polished in the second polishing step.

The insulation substrate 1 is made of ceramic, single crystal, or the like, for example, sapphire. Sapphire refers to single crystal of alumina. For example, the dimensions of the insulation substrate 1 are from 50 mm to 200 mm in diameter and from 0.2 mm to 1.0 mm in thickness.

As illustrated in FIG. TA, the via hole 3 is formed by a known method such as mechanical processing such as a drill, laser machining, and etching. After the hole processing, heat treatment may be performed for mitigating crystal defects and stresses caused by the processing. The diameter of the via hole 3 is, for example, from 100 μm to 500 μm.

The material of the metal 4 is not particularly limited. Silver, copper, gold, and alloys based thereon are preferable because of high electrical conductivity thereof. Platinum group elements, titanium, niobium, tantalum, and alloys based thereon are suitable because of high corrosion resistance thereof. The third metal layer 4c is formed by electroplating. The first metal layer 4a and the second metal layer 4b are preferably formed by electroplating, but may also be formed by filling a paste containing a metal component and firing the paste (in this case, the formation of the first metal layer 4a is unnecessary).

The formation of a metal using a paste requires firing at a relatively high temperature, and thermal stress due to shrinkage after firing causes deformation and cracking. When the firing temperature is equal to or less than the melting point of the metal, the metal becomes porous with many voids, and the surface roughness (arithmetic average roughness) of a polished surface increases. The metal 4 can be formed by plating at a relatively low temperature, so that deformation and cracking are less likely to occur. The metal 4 that is dense and has few voids can be formed, and the surface roughness of a polished surface can be easily reduced. As described below, by forming the second metal layer 4b serving as the main component of the metal 4 by plating, cracking and deformation can be reduced. By forming the third metal layer 4c serving as the surface of the metal 4 by plating, a dense surface with a desired surface roughness can be produced. Plating on a paste-fired metal with many voids has a concern of residual plating solution, whereas plating on a plated metal with few voids reduces such concerns.

Among plating methods, electroplating has a high film formation rate and is excellent in productivity. Direct electroplating of the metal 4 on the insulation substrate 1 is not possible. Therefore, as illustrated in FIG. 1B, the seed layer 5 is formed on the first main surface 2a of the insulation substrate 1 by a method such as electroless plating or vapor deposition. The seed layer 5 is made of, for example, nickel, titanium, chromium, or palladium.

The metal 4 is formed by electroplating starting from the seed layer 5. First, the seed layer 5 is used as a cathode electrode, and an anode electrode (metal source) is disposed on the first main surface 2a side. As illustrated in FIG. 1C, the first metal layer (blocking layer) 4a is formed, and a side of the via hole 3 on the first main surface 2a side is blocked (blocking step). Even though the via hole 3 is not completely blocked, the via hole 3 may be blocked until the opening area is approximately equal to or less than half the cross-sectional area of the via hole 3.

The first metal layer 4a is used as a cathode and an anode electrode is disposed on the second main surface 2b side. As illustrated in FIG. 1D, the second metal layer (filling layer) 4b is formed and the via hole 3 is filled with the metal 4 (filling step). From the viewpoint of productivity, the film formation rate of the second metal layer 4b is preferably greater than the film formation rate of the first metal 4a. For example, the film formation rate can be increased by increasing the current density during electroplating.

The filling layer 4b grows in the via hole 3 in the thickness direction (direction from the first main surface 2a to the second main surface 2b) and also grows in the radial direction (direction toward the center line from the inner wall surface). Therefore, voids are likely to be formed near the center line where the grown metal 4 joins. In the circuit substrate 10, voids are present as open pores on the surface of the metal 4 or are present as closed pores near the surface, which causes peeling of a wiring electrode in the manufacturing process of a product using the circuit substrate 10. Chemicals and the like used in the manufacturing process may remain and cause adverse effects on the product.

Figure 1E:
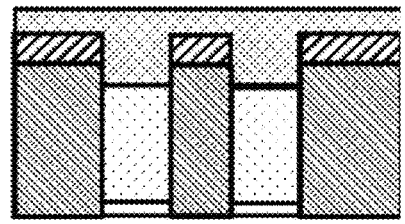
Figure 1B:
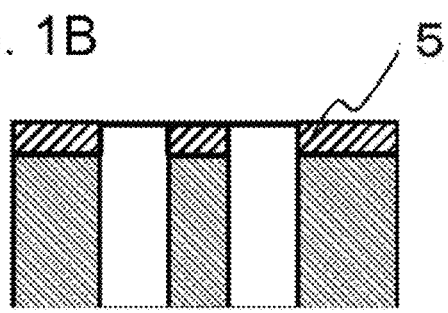
Figure 1F:
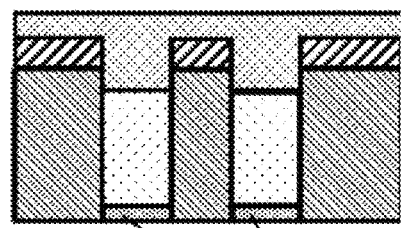
Figure 1C:
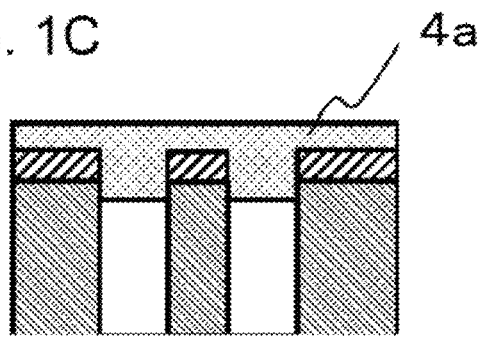

The second main surface 2b is polished using a lapping device or the like to remove the metal 4 protruding from the second main surface 2b as illustrated in FIG. 1E (first polishing step). The metal 4 is softer and easier to polish than the insulation substrate 1 made of ceramic such as alumina or oxide single crystal such as sapphire. Therefore, a step L1 can be formed between the main surface 2 and the metal 4 after the polishing (surface of the metal 4 can be lowered). The size of the step L1 can be adjusted in various conditions such as the material, shape, grain size, slurry pH, processing pressure, and processing time of abrasive grains. The surface of the polished metal 4 (that is, an interface between the second metal layer 4b and the third metal layer 4c) is flat and has a uniform surface roughness compared to a non-polished surface. An anode electrode is disposed on the polished surface side of the metal 4, and as illustrated in FIG. 1F, the third metal layer 4c is formed to coat the polished surface (coating step). When only one side is polished in the first polishing step, the anode electrode may be disposed only on the one side. The third metal layer 4c is preferably dense, that is, has fewer voids than the second metal layer 4b. When the film formation rate of the third metal layer 4b is lower than the film formation rate of the second metal 4b, the surface of the metal layer 4 is preferably coated with a denser film. For example, the film formation rate can be reduced by lowering the current density.

By coating the surface of the metal 4 with the third metal layer 4c that is denser or has fewer voids, open pores on the surface of the metal 4 and closed pores near the surface of the metal 4 can reduce adverse effects on subsequent steps and element performance. When the third metal layer 4c is harder than the second metal layer 4b (for example, has a higher Vickers hardness), the step with the main surface 2 is easily reduced and the surface roughness is easily reduced. The third metal layer 4c may be different from the second metal layer 4b in constituent metal elements or the composition of the constituent metal elements. The hardness, denseness, and composition of constituent elements of the second metal layer 4b and the third metal layer 4c may be changed in a continuous (linear or curved) or discontinuous stepwise manner within the layer. Thus, the third metal layer 4c denser and harder than the second metal layer 4b can be formed while continuously or stepwise adjusting the physical properties of the metal layer 4 (for example, thermal expansion coefficient, conductivity, and the like).

The step L1 of the surface of the metal 4 (second metal layer 4b) and the main surface 2 after the first polishing step is preferably greater than the step L1 of the surface of the metal 4 (third metal layer 4c) and the main surface 2 after the second polishing step. Thus, the third metal layer 4c can cover not only the voids on the surface of the second metal layer 4b, but also the entire surface of the second metal layer 4b. The step L1 between the surface of the metal 4 and the main surface 2 after the first polishing step is preferably from 1 μm to 10 μm (surface of the metal 4 is lower than the main surface 2 by 1 μm to 10 μm).

The third metal layer 4c needs to have a thickness sufficient to cover the voids on the surface of the second metal layer 4b. By setting the step L1 to be equal to or greater than 1 μm, the surface of the second metal layer 4b and voids exposed on the surface can be coated with the third metal layer 4c in the subsequent coating step. The film formation rate of the third metal layer 4c tends to be reduced in order to deposit the dense third metal layer 4c. In order to form the metal layer 4 with good productivity, the third metal layer 4c is preferably thin. By setting the step L1 to be equal to or less than 10 μm, the thickness of the third metal layer 4c formed in the subsequent coating step can be reduced. By forming the step L1 of an appropriate size in the first polishing step, the third metal layer 4c having a sufficient thickness required to cover the voids on the surface of the second metal layer 4b can be formed. For example, the step L1 between the surface of the metal 4 and the main surface 2 after the polishing process can be increased by increasing the pressing force during the polishing process or by increasing the processing time. When the arithmetic average roughness Ra of the surface (polished surface) of the second metal layer 4b after the first polishing step is about from 0.1 μm to 0.5 μm, the adhesion with the third metal layer 4c to be subsequently formed increases.

After the first polishing step and the coating step are performed on the second main surface 2b, the metal 4 and the seed layer 5 protruding from the first main surface 2a may be removed by performing the first polishing step on the first main surface 2a, and the third metal layer 4c may be formed on both the side of the metal 4 facing the first main surface 2a and the side of the metal 4 facing the second main surface 2b by performing the coating step on the second main surface 2b. In the coating step on the side of the metal 4 facing the second main surface 2b, when the metals 4 of the via holes 3 are covered by the third metal layer 4c to be connected to each other, the metals 4 are easily electrically connected to each other on the second main surface 2b in the coating step. When an electrical connection between the metals 4 in the via holes 3 is difficult after the first main surface 2b is polished (the seed layer 5 is removed), the coating step may be performed by electroless plating, or electroplating may be performed after a metal layer for electrical connection is formed on any of the main surfaces 2. In the first polishing step, the metal 4 and the seed layer 5 protruding from the main surface 2 may be removed by polishing both the main surfaces 2 by using a double-sided lapping device, and then the third metal layer 4c may be formed on both the main surfaces 2 in the coating step.

Figure 1G:
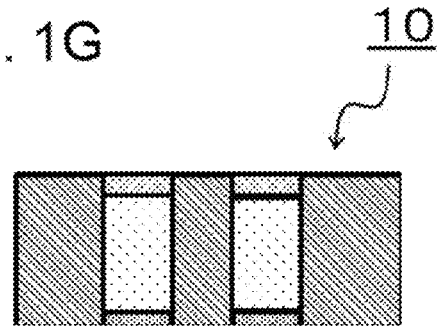
Figure 1D:
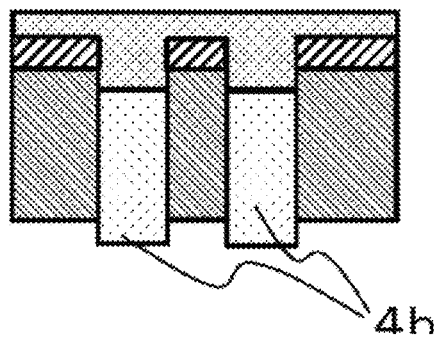
Figure 2A:
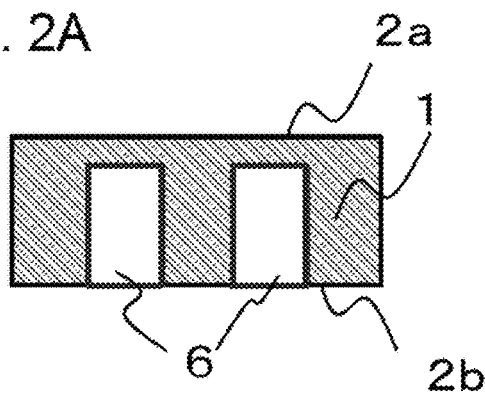
FIGS. 2A to 2F are schematic views illustrating a second embodiment of the present disclosure.
Figure 2D:
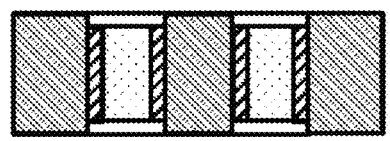
Figure 2B:
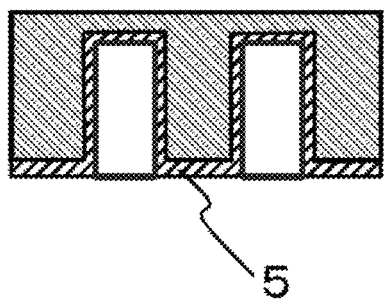
Figure 2E:
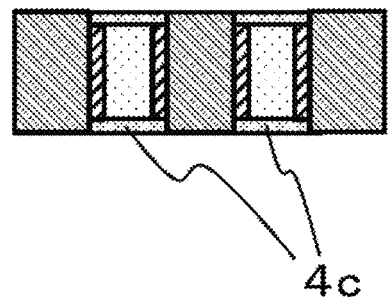
Figure 2C:
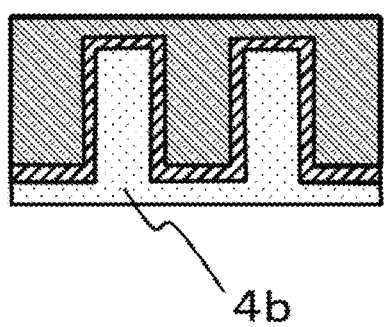
Figure 2F:
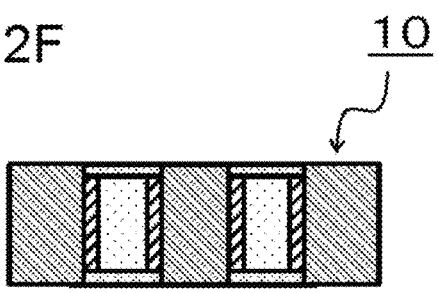

Finally, both the main surfaces 2 are polished using a lapping device or the like, and the metal 4 protruding from the main surface 2 (the seed layer 5 when the seed layer 5 remains) is polished and removed as illustrated in FIG. 1G (second polishing step). When the two main surfaces 2 are simultaneously polished using a double-sided lapping device, productivity is improved.

Figure 3:
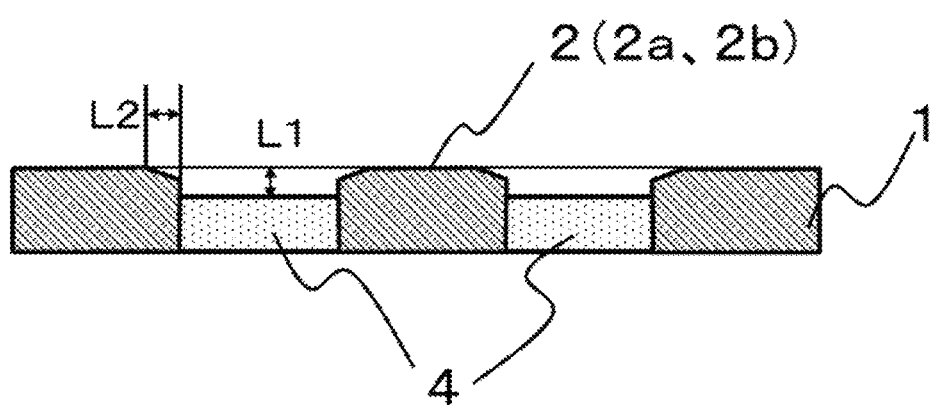
FIG. 3 is a schematic cross-sectional view of a circuit substrate of the present disclosure.

FIG. 3 illustrates a schematic cross-sectional view of the vicinity of the main surface 2 of the circuit substrate 10 of the present disclosure. The third metal layer 4c preferably covers the entire surface of the second metal layer 4b. The step L1 between the surface of the metal 4 and the main surface 2 is preferably equal to or less than 1 μm. The thickness of the third metal layer 4c is preferably equal to or greater than 0.1 μm. Both the arithmetic average roughness Ra of the main surface 2 and the arithmetic average roughness Ra of the metal 4 in the insulation substrate 1 are preferably equal to or less than 0.3 μm, and the difference between the both arithmetic average roughnesses Ra is preferably equal to or less than 0.2 μm. Thus, the connection with the wiring metal is good and disconnection is less likely to occur.

Roll-off (sagging) occurs in the vicinity of the via hole 3 of the main surface 2 during the polishing process. When a width L2 of the roll-off is equal to or less than 1 μm (that is, approximately the same as the step L1 between the surface of the metal 4 and the main surface 2), since the wiring metal is connected on the main surface 2 and the metal 4 with a relatively gentle slope, disconnection is less likely to occur.

FIG. 2 is a schematic view illustrating a second embodiment of the present disclosure. The second embodiment includes a hole forming step (FIG. 2A) of forming, in the insulation substrate 1, a non-through hole 6 opening only on the second main surface 2b; a seed layer formation step (FIG. 2B) of forming the seed layer 5 on an inner wall of the non-non-through hole 6; a filling step (FIG. 2C) of filling the non-through hole 6 with the second metal layer 4b by electroplating; a first polishing step (FIG. 2D) of polishing the metal 4 of at least one of the main surfaces 2; a coating step (FIG. 2E) of coating the polished surface of the metal 4 with the third metal layer 4c by plating; and a second polishing step (FIG. 2F) of polishing the metal 4 on the first main surface 2a and the second main surface 2b.

In the second embodiment, since one side of the non-through hole 6 is blocked, the first metal layer (blocking layer) 4a is not provided. The metal 4 includes the second metal layer (filling layer) 4b and the third metal layer (covering layer) 4c. The seed layer 5 is formed on the inner wall of the non-through hole 6 and the second main surface 2b. The first main surface 2a of the insulation substrate 1, which is a non-opening side (no metal 4 is exposed), is polished in the first polishing step or the second polishing step to expose the metal 4 and form the via hole 3. The other configurations are basically the same as those of the first embodiment. FIG. 2 illustrates an embodiment in which both the main surfaces 2 are polished in the first polishing step.

After the via hole 3 passing through the main surface 2 is formed in the same and/or similar manner as in the first embodiment, the first main surface 2a may be covered with a mask such as resin to form the non-through hole 6, and the mask may be removed after the second metal layer 4b and the third metal layer 4c are formed in the same and/or similar manner as in the second embodiment. After the first metal layer 4a that incompletely blocks the first main surface 2a is formed in the same and/or similar manner as in the first embodiment, the first main surface 2a may be covered with a mask such as resin to be completely closed, and the mask may be removed after the second metal layer 4b and the third metal layer 4c are formed.

In this specification, the polishing process means a process of removing the metal 4 protruding from the main surface 2 and planarizing the main surface 2. The polishing process also includes a grinding process of increasing surface roughness before and after processing, and CMP processing using both mechanical processing and chemical processing.

REFERENCE SIGNS

1 Insulation substrate
2 Main surface
2a First main surface
2b Second main surface
3 Via hole
4 Via Metal (metal)
4a First metal layer (blocking layer)
4b Second metal layer (filling layer)
4c Third metal layer (covering layer)
5 Seed layer
6 Non-through hole
10 Circuit substrate

The invention claimed is:

1. A circuit substrate comprising:
an insulation substrate formed with a plurality of via holes passing through a first main surface and a second main surface, the first main surface and the second main surface being opposing main surfaces;
a second metal layer with which the plurality of via holes are filled; and
a third metal layer coating an entire surface of the second metal layer,
wherein the second metal layer is a plated metal, and the third metal layer is a plated metal,
wherein the third metal layer is denser and harder than the second metal layer, and
wherein an interface between the second metal layer and the third metal layer is located between the first main surface and the second main surface in the via hole, and the interface between the second metal layer and the third metal layer is a polished surface.

2. The circuit substrate according to claim 1, wherein a thickness of the third metal layer is equal to greater than 0.1 µm.

3. The circuit substrate according to claim 1, wherein a step between at least one of the opposing main surfaces and a surface of the third metal layer is equal to or less than 1 µm.

4. The circuit substrate according to claim 1, wherein a first arithmetic average roughness Ra of at least one of the opposing main surfaces and a second arithmetic average roughness Ra of a surface of the third metal layer are equal to or less than 0.3 µm, and a difference between the first arithmetic average roughness Ra and the second arithmetic average roughness Ra is equal to or less than 0.2 µm.

5. The circuit substrate according to claim 1, wherein a width of roll-off of a connecting portion between at least one of the opposing main surfaces and each via hole of the plurality of via holes is equal to or less than 1 µm.

6. A method for manufacturing the circuit substrate of claim 1, the method comprising:
forming, in the insulation substrate, a via hole having openings on the first main surface and the second main surface or a non-through hole having an opening only on the second main surface;
filling the via hole or the non-through hole with the metal;
polishing the metal exposed on at least one of the first main surface and the second main surface to lower a polished surface of the metal in the insulation substrate and to form a step between the polished surface of the metal and the at least one of the first main surface and the second main surface;
coating the polished surface of the metal by plating; and
polishing the first main surface and the second main surface to provide a via hole of the plurality of via holes that passes through the first main surface and the second main surface.

7. The method according to claim 6, wherein
in the filling of the via hole or the non-through hole, the metal is formed by plating.

8. The method according to claim 7, wherein
the forming the via hole or the non-through hole comprises forming the via hole having openings on the first main surface and the second main surface,
the method further comprising forming a seed layer on the first main surface, and blocking the via hole on the first main surface side with the metal by electroplating, and
wherein the filling of the via hole is performed by electroplating.

9. The method according to claim 7, wherein
the forming the via hole or the non-through hole comprises forming the non-through hole, and
the method further comprising forming a seed layer on an inner wall of the non-through hole, and
wherein the filling of the non-through hole is performed by electroplating.

10. The method according to claim 6, wherein
the insulation substrate is made of ceramic or a single crystal.

11. The method according to claim 6, wherein
the step between the polished surface of the metal and the at least one of the first main surface and the second main surface is greater than a step between the main surface and the polished surface of the metal after the polishing of the metal on the first main surface and the second main surface.

12. A circuit substrate comprising:
an insulation substrate formed with a plurality of via holes passing through a first main surface and a second main surface, the first main surface and the second main surface being opposing main surfaces;
a second metal layer with which the plurality of via holes are filled; and
a third metal layer coating an entire surface of the second metal layer,
wherein the second metal layer is a plated metal, and the third metal layer is a plated metal,
wherein a first arithmetic average roughness Ra of at least one of the opposing main surfaces and a second arithmetic average roughness Ra of a surface of the third metal layer are equal to or less than 0.3 µm, and a difference between the first arithmetic average roughness Ra and the second arithmetic average roughness Ra is equal to or less than 0.2 µm, and
wherein an interface between the second metal layer and the third metal layer is located between the first main surface and the second main surface in the via hole, and the interface between the second metal layer and the third metal layer is a polished surface.

13. The circuit substrate according to claim 12, wherein a thickness of the third metal layer is equal to greater than 0.1 μm.

14. The circuit substrate according to claim 12, wherein a step between at least one of the opposing main surfaces and a surface of the third metal layer is equal to or less than 1 μm.

15. The circuit substrate according to claim 12, wherein a width of roll-off of a connecting portion between at least one of the opposing main surfaces and each via hole of the plurality of via holes is equal to or less than 1 μm.

* * * * *